(12) United States Patent
He (10) Patent No.: US 11,026,336 B1
(45) Date of Patent: Jun. 1, 2021

(54) DISPLAY DEVICE

(71) Applicant: Shanghai Tianma AM-OLED Co.,Ltd., Shanghai (CN)

(72) Inventor: Yongxin He, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/832,686

(22) Filed: Mar. 27, 2020

(30) Foreign Application Priority Data

Dec. 3, 2019 (CN) .......................... 201911222953.1

(51) Int. Cl.
*H05K 5/00* (2006.01)
*H05K 5/02* (2006.01)
*G06F 1/16* (2006.01)

(52) U.S. Cl.
CPC ......... *H05K 5/0017* (2013.01); *H05K 5/0226* (2013.01); *G06F 1/1652* (2013.01)

(58) Field of Classification Search
CPC .... G06F 1/1652; G06F 1/1681; G06F 1/1616; G06F 1/1641; G06F 1/1656; H05K 5/0017; H05K 5/0226; H05K 5/0217; H05K 5/0086
See application file for complete search history.

(56) References Cited

U.S. PATENT DOCUMENTS

| | | | | |
|---|---|---|---|---|
| 9,778,682 | B2 * | 10/2017 | Lee | G06F 1/1641 |
| 9,786,207 | B2 * | 10/2017 | Kim | G06F 1/1652 |
| 10,881,009 | B2 * | 12/2020 | Jiang | H04M 1/0268 |
| 2011/0286157 | A1 * | 11/2011 | Ma | G06F 1/1652 |
| | | | | 361/679.01 |
| 2013/0010405 | A1 * | 1/2013 | Rothkopf | H05K 5/0226 |
| | | | | 361/679.01 |
| 2013/0021762 | A1 * | 1/2013 | van Dijk | H05K 5/0017 |
| | | | | 361/749 |
| 2013/0342094 | A1 * | 12/2013 | Walters | G06F 1/1615 |
| | | | | 312/319.2 |
| 2014/0355195 | A1 * | 12/2014 | Kee | G06F 1/1641 |
| | | | | 361/679.27 |
| 2017/0142847 | A1 * | 5/2017 | Park | G09F 9/301 |
| 2019/0150302 | A1 * | 5/2019 | Heng | H05K 5/0017 |
| | | | | 361/809 |

FOREIGN PATENT DOCUMENTS

| | | |
|---|---|---|
| CN | 103582340 A | 2/2014 |
| CN | 104680940 A | 6/2015 |
| CN | 107424518 A | 12/2017 |
| CN | 208806016 U | 4/2019 |

* cited by examiner

*Primary Examiner* — Abhishek M Rathod
(74) *Attorney, Agent, or Firm* — Anova Law Group PLLC (57) ABSTRACT

A display device is provided in the present disclosure. The display device includes a flexible screen, a support structure, and a foldable structure. The flexible screen includes a first main body, a second main body, and a third main body connected to each of the first main body and the second main body. The support structure includes a first support portion configured to support the first main body and a second support portion configured to support the second main body. The foldable structure overlaps the third main body, and the first support portion and the second support portion are connected to each other through the foldable structure. During a folding process of the display device, at least a portion of the foldable structure is in contact with the third main body and configured to roll relative to the third main body.

16 Claims, 8 Drawing Sheets

DISPLAY DEVICE

CROSS-REFERENCE TO RELATED APPLICATION

This application claims the priority of Chinese Patent Application No. 201911222953.1, filed on Dec. 3, 2019, the content of which is incorporated herein by reference in its entirety.

TECHNICAL FIELD

The present disclosure generally relates to the field of display technology and, more particularly, relates to a display device.

BACKGROUND

With the development of flexible screens, various folding display devices have emerged. The folding of the flexible screen may be implemented by a hinge. For example, the flexible screen may be attached to a support plate with the hinge. When folding the flexible screen by expanding and contracting the hinge, the flexible screen and the hinge are separated from each other to certain extent without tight attachment. As a result, creases may be formed in the flexible screen and the performance of the flexible screen may be undesirable.

SUMMARY

One aspect of the present disclosure provides a display device. The display device includes a flexible screen, including a first main body, a second main body, and a third main body, where the third main body, between the first main body and the second main body, is connected to each of the first main body and the second main body. The display device further includes a support structure, including a first support portion and a second support portion, where the first support portion is configured to support the first main body, and the second support portion is configured to support the second main body. The display device further includes a foldable structure, where the foldable structure overlaps the third main body; the first support portion and the second support portion are connected to each other through the foldable structure; a working state of the display device includes a folding state, and the first main body overlaps the second main body in the folding state; and during a folding process of the display device, at least a portion of the foldable structure is in contact with the third main body and configured to roll relative to the third main body.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming a part of the specification demonstrate embodiments of the present disclosure and, together with the specification, describe the principles of the present disclosure.

DETAILED DESCRIPTION

The "first", "second" and the like in the specification and claims of the present disclosure and the above-mentioned drawings may be used to distinguish different objects and may not be used to describe specific orders. Furthermore, the term "include" and any variations thereof may be intended to cover non-exclusive inclusion. For example, a process, a method, a system, a product, or a device containing a series of steps or units may not be limited to the listed steps or units, but also may optionally include steps or units which are not listed, or also optionally include other steps or units inherent to the process, the method, the product, or the device.

Reference to "embodiment" herein may indicate that a particular feature, a structure, or a characteristic described in connection with the embodiment may be included in at least one embodiment of the present disclosure. The appearances of such phrase in various places in the specification may not be necessarily all referring to a same embodiment, nor an independent or alternative embodiment that are mutually exclusive with other embodiments. It should be clearly and implicitly understood by those skilled in the art that the embodiments described herein may be combined with other embodiments.

The term "and/or" in the specification may merely be an association relationship describing associated objects, which may indicate that three relationships may exist. For example, A and/or B may indicate that there are three cases including A alone, A and B, and B alone. In addition, the character "/" in the specification, unless otherwise specified, may indicate an "or" relationship of related objects.

It should be understood that the preferred embodiments described below may merely be used to illustrate and explain the present disclosure and may not be intended to limit the present disclosure. And in the case of no conflict, the embodiments in the present disclosure and the features in the embodiments may be combined with each other. In addition, the shapes and sizes of each component in the drawings do not reflect actual proportions, and the purpose may merely be illustrating the present disclosure.

In order to better understand the above-mentioned technical solutions, the technical solutions of the present disclosure may be described in detail through the drawings and specific embodiments hereinafter. It should be understood that the embodiments of the present disclosure and specific features in the embodiments are detailed descriptions of the technical solutions of the present disclosure, rather than limiting the technical solutions of the present disclosure. In the case of no conflict, the embodiments of the present disclosure and the technical features in the embodiments may be combined with each other.

Figure 1:
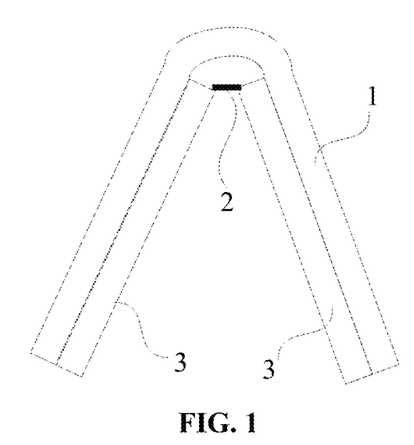
FIG. 1 illustrates a structural schematic of an existing flexible display device in a folding state.

FIG. 1 illustrates a structural schematic of an existing flexible display device in a folding state. For example, a flexible screen 1 may be attached to a support plate 3 disposed with a hinge 2. When the flexible screen 1 is folded, the hinge 2 may expand and contract, thus the flexible screen 1 and the hinge 2 may be separated from each other to certain extent without tight attachment. As a result, creases may be formed in the flexible screen, and the performance of the flexible screen may be undesirable.

Figure 2:
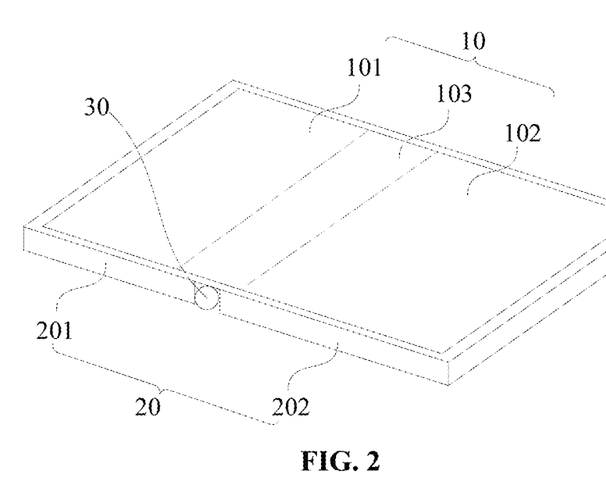
FIG. 2 illustrates a stereoscopic view of a display device in an unfolded state according to the embodiments of the present disclosure.
Figure 3:
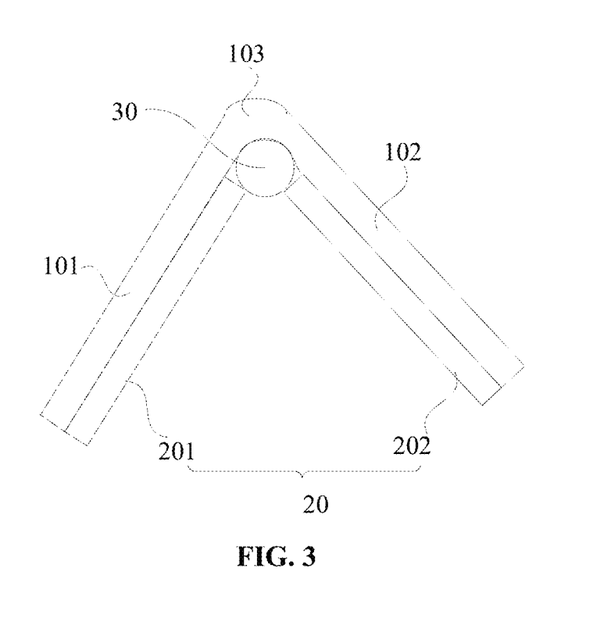
FIG. 3 illustrates a side view of a display device in a folding state according to the embodiments of the present disclosure.
Figure 4:
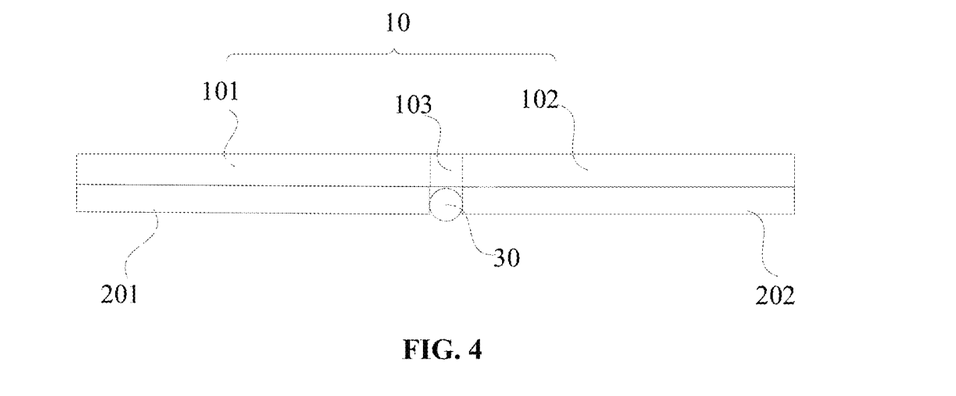
FIG. 4 illustrates a side view of a display device in an unfolded state according to the embodiments of the present disclosure.

The embodiments of the present disclosure provide a display device, as shown in FIG. 2 to FIG. 4. FIG. 2 illustrates a stereoscopic view of the display device in an unfolded (e.g., unbent) state according to the embodiments of the present disclosure. FIG. 3 illustrates a side view of a display device in the folding state according to the embodiments of the present disclosure. FIG. 4 illustrates a side view of the display device in the unfolded state according to the embodiments of the present disclosure. In an implementation process, the display device may be any product or component having a display function, such as a mobile phone (shown in FIG. 2), a tablet computer, a television, a display, a notebook computer, a digital phone frame, a navigator, a watch, and the like.

In the embodiments of the present disclosure, as shown in FIG. 2 to FIG. 4, the display device may include a flexible screen 10, and the flexible screen 10 may include a first main body 101, a second main body 102, and a third main body 103. The third main body 103 between the first main body 101 and the second main body 102, may be connected to each of the first main body 101 and the second main body 102. In an implementation process, the first main body 101, and the second main body 102, and the third main body 103 may be obtained by dividing a complete flexible screen, as shown in FIG. 2. In practical applications, the areas occupied by the first main body 101, the second main body 102, and the third main body 103 on the flexible screen 10 may be other circumstances, which may not be limited herein according to the embodiments of the present disclosure. Furthermore, the first main body 101, the second main body 102, and the third main body 103 may respectively correspond to independent flexible screens.

In the embodiments of the present disclosure, the display device may further include a support structure 20, and the support structure 20 may include a first support portion 201 and a second support portion 202. The first support portion 201 may be configured to support the first main body 101, and the second support portion 202 may be configured to support the second main body 102. In an implementation process, the first support portion 201 may be attached to the first main body 101, and the second support portion 202 may be attached to the second main body 102. In such way, in the process of folding the first main body 101 relative to the second main body 102, the first support portion 201 may be relatively folded relative to the second support portion 202, thereby implementing the movement synchronization of the main bodies and corresponding support portions.

In the embodiments of the present disclosure, the display device may further include a foldable structure 30. The foldable structure 30 may overlap the third main body 103. The first support portion 201 and the second support portion 202 may be connected through the foldable structure 30. A working state of the display device includes a folding state, and the first main body 201 overlaps the second main body 202 in the folding state. During a folding process of the display device, the first support portion 201 may be folded relative to the second support portion 202 through the foldable structure 30, and at least a portion of the foldable structure 30 may be in contact with the third main body 103 and also roll relative to the third main body 103. In an implementation process, the foldable structure 30, the first support portion 201, and the second support portion 202 may be on a same side of the flexible screen 10; the foldable structure 30 may be disposed in a region corresponding to the region of the third main body 103; and the foldable structure 30 may overlap the third main body 103. In addition, the foldable structure 30 may be connected to the first support portion 201 and the second support portion 202, respectively. Therefore, when any support portion is folded, folding of the corresponding main body may be driven by the foldable structure 30, thereby improving the performance of the flexible screen 10.

Furthermore, during the folding process of the display device, the first support portion 201 may be folded relative to the second support portion 202 through the foldable structure 30, and at least a portion of the foldable structure 30 may be in contact with the third main body 103 and also roll relative to the third main body 103. That is, in the process of folding the first main body 101 and the second main body 102 of the flexible screen 10, the first support portion 201 and the second support portion 202 may be simultaneously folded with corresponding main bodies through the foldable structure 30. In addition, during the complete folding process, at least a portion of the foldable structure 30 may be in contact with the third main body 103 and also roll relative to the third main body 103, that is, the friction between contact portions of the foldable structure 30 and the third main body 103 may be rolling friction, and the interaction force between the contact portions may be relatively small. Therefore, the foldable structure 30 may be ensured to protect the third main body 103 while supporting the third main body 103. At least a portion of the foldable structure 30 may always be in contact with the third main body 103 and also roll relative to the third main body 103 during the complete folding process, thus the flexible screen 10 may be effectively protected while avoiding the creases of the flexible screen 10.

In the embodiments of the present disclosure, the first main body 101 may be slidably connected to the first support portion 201, and the second main body 102 may be fixedly connected to the second support portion 202. In such way, during the folding process of the first main body 101 relative to the second main body 102, the first main body 101 may slide relative to the first support portion 201, thereby ensuring folding flexibility between the first main body 101 and the second main body 102 during the folding process of the flexible screen 10, reducing tensile stress received by the flexible screen 10 during the folding process, and improving the performance of the display device.

Figure 5:
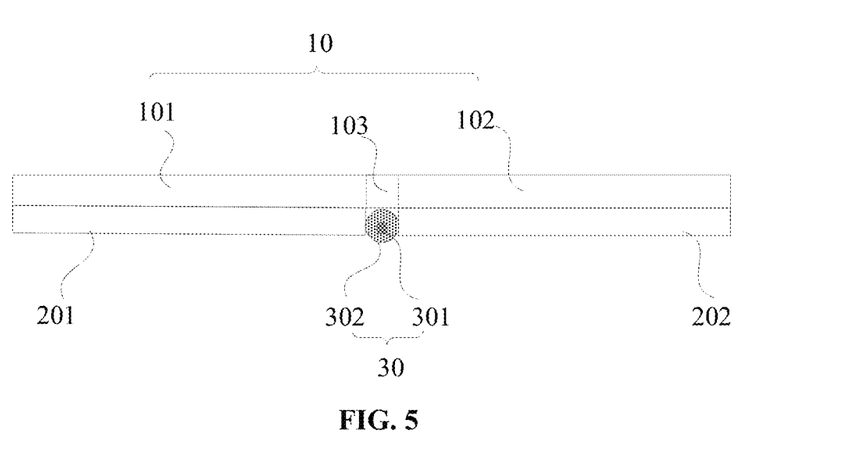
FIG. 5 illustrates another side view of a display device in an unfolded state according to the embodiments of the present disclosure.

In the embodiments of the present disclosure, FIG. 5 illustrates a side view of the display device in the unfolded state according to the embodiments of the present disclosure. For example, the foldable structure 30 may include an axle 301 and an axle sleeve 302 surrounding the axle 301. The first support portion 201 and the second portion 202 may be connected through the axle 301. During the folding process of the display device, at least a portion of the axle sleeve 302 may be in contact with the third main body 103 and also roll relative to the third main body 103. In such way, when the first main body 101 is folded relative to the second main body 102, at least a portion of the axle sleeve 302 may always be in contact with the third main body 103 and also roll relative to the third main body 103, thereby effectively supporting the third main body 103 by the axle sleeve 302. Furthermore, the friction between the axle sleeve 302 and the third main body 103 may be rolling friction due to the rolling of the axle sleeve 302, thereby effectively protecting the third main body 103, improving the service life of the flexible screen 10, and improving the performance of the display device.

In an implementation process, the connection manners between the first support portion 201 and the second support portion 202 may be various. Any one of the first support portion 201 and the second support portion 202 may be fixedly connected to the axle 301, and the other support portion may be rotatably connected to the axle 301. In an implementation process, the second support portion 202 may be fixedly connected to the axle 301, and the first support portion 201 may be rotatably connected to the axle 301. Both the first support portion 201 and the second support portion 202 may also be connected to the axle 301. Therefore, while the relative rotation between the first support portion 201 and the second support portion 202 may be implemented through the axle 301, the flexible rotation between the first main body 101 and the second main body 102 may be implemented, thereby ensuring the folding flexibility between the first main body 101 and the second main body 102. Obviously, in practical applications, the connection manners between the first support portion 201, the second support portion 202, and the axle 301 may also be selected according to application scenarios, which may not be limited herein according to the embodiments of the present disclosure.

In the embodiments of the present disclosure, the axle 301 and the axle sleeve 302 may be sleeved together through a clearance fit. That is, for the fit manner, the outer diameter of the axle 301 is less than the outer diameter of the axle sleeve 301, and a clearance is between the axle 301 and the axle sleeve 302. In such way, during the folding process of the first main body 101 relative to the second main body 102, the axle sleeve 302 may roll freely relative to the axle 301, thereby ensuring the relative rolling between the axle sleeve 302 and the third main body 103, and protecting the flexible screen 10 from damage during the folding process.

In the embodiments of the present disclosure, the axle 301 may be made of a material including at least one of stainless steel, chromium carbide, high manganese steel, tungsten carbide, alumina ceramic, and nylon; and/or the axle sleeve 302 may be made of a material including at least one of stainless steel, chromium carbide, high manganese steel, tungsten carbide, alumina ceramic, and nylon.

In an implementation process, the materials of the axle 301 and the axle sleeve 302 may be the same or different. When the axle 301 is made of a material including at least one of stainless steel, chromium carbide, high manganese steel, tungsten carbide, alumina ceramic, and nylon, the axle 301 may be a structure with high hardness and desirable abrasion resistance, thereby increasing the folding number of the foldable structure 30, and improving the service life of the display device while ensuring the performance of the foldable structure 30. Furthermore, when the axle sleeve 302 is made of a material including at least one of stainless steel, chromium carbide, high manganese steel, tungsten carbide, alumina ceramic, and nylon, the axle sleeve 302 may be a structure with high hardness and desirable abrasion resistance, thereby increasing the folding number of the foldable structure 30 is used, and improving the service life of the display device while ensuring the performance of the foldable structure 30. In addition, in practical applications, the materials corresponding to the axle 301 and the axle sleeve 302 may also be selected according to application scenarios of the foldable structure 30, which may not be limited herein according to the embodiments of the present disclosure.

Figure 6:
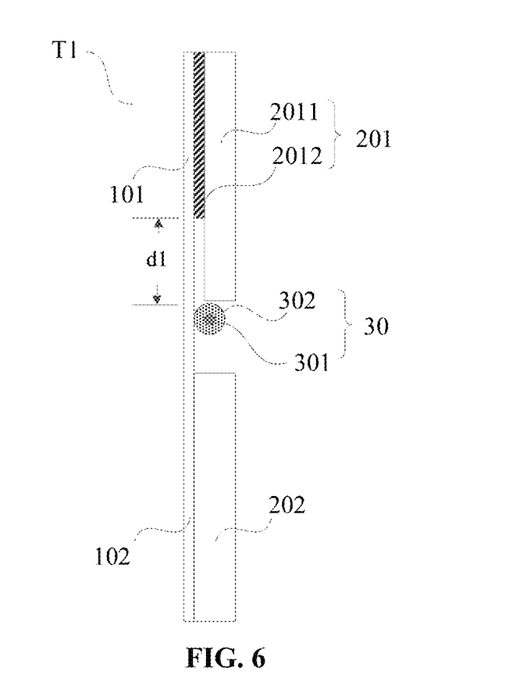
FIG. 6 illustrates a schematic of a display device in an unfolded state T1 according to the embodiments of the present disclosure.
Figure 7:
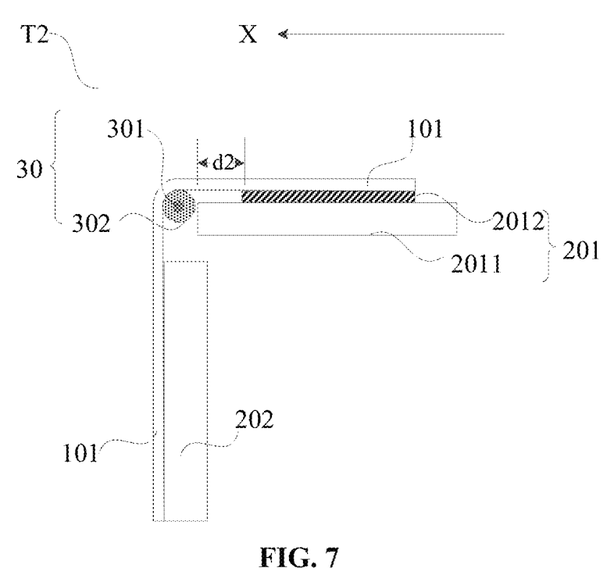
FIG. 7 illustrates a schematic of a display device in a folding state T2 according to the embodiments of the present disclosure.
Figure 8:
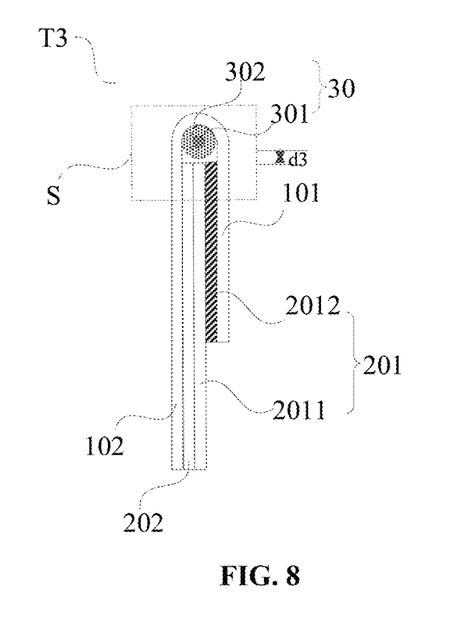
FIG. 8 illustrates a schematic of a display device in a folded state T3 according to the embodiments of the present disclosure.

In the embodiments of the present disclosure, as shown in FIG. 6 to FIG. 8, FIG. 6 illustrates a schematic of the display device in an unfolded state T1; FIG. 7 illustrates a schematic of the display device in a folding state T2; and FIG. 8 illustrates a schematic of the display device in a folded (e.g., close) state T3. In an implementation process, the first support portion 201 may include a support element 2011 and a sliding element 2012. The sliding element 2012 may be fixedly connected to first main body 101 and slidably connected to the support element 2011. When the first support portion 201 is folded relative to the second support portion 202 through the foldable structure 30, the sliding element 2012 may slide relative to the support element 2011 along a first direction, where the first direction may be a direction perpendicular to the folding axis where the first main body 101 is folded relative to the second main body 102.

In an implementation process, when the first main body 101 is folded relative to the second main body 102, the first main body 101 may drive the sliding element 2012 to slide relative to the support element 2011, thereby ensuring the folding performance of the flexible screen 10. For example, when the first support portion 201 is folded relative to the second support portion 202 through the foldable structure 30, the sliding element 2012 may slide relative to the support element 2011 along the first direction, where the first direction may be a direction perpendicular to the folding axis where the first main body 101 is folded relative to the second main body 102. In practical applications, the folding axis may be an extending direction along the central axis of the axle 301 or may be an extending direction along the central axis of the axle sleeve 302. The first direction may be a direction shown by an arrow X in FIG. 7. With reference to FIGS. 6-8, for example, when the flexible screen 10 is folded from the unfolded state T1 where an included angle between the first main body 101 and the second main body 102 is 180° to the folded state T3 where an included angle between the first main body 101 and the second main body 102 is 0°, the sliding element 2012 may slide relative to the support element 2011 along the direction shown by the arrow X. For example, when the display device is at the unfolded state T1 shown in FIG. 6, a distance between the end of the sliding element 2012 close to the foldable structure 30 and the axle sleeve 302 may be d1; when the display device is folded from the unfolded state T1 shown in FIG. 6 to the folding state T2 shown in FIG. 7, a distance between the end of the sliding element 2012 close to the foldable structure 30 and the axle sleeve 302 may be d2; when the display device is folded from the folding state T2 shown in FIG. 7 to the folded state T3 shown in FIG. 8, a distance between the end of the sliding element 2012 close to the foldable structure 30 and the axle sleeve 302 may be d3, where d1>d2>d3. In an implementation process, the folding performance of the display device may be ensured by the slide connection of the sliding element 2012 relative to the support element 2011. In an implementation process, if the flexible screen 10 is folded from the folded state T3 where the included angle between the first main body 101 and the second main body 102 is 0° to the unfolded state T1 where the included angle between the first main body 101 and the second main body 102 is 180°, that is, if the display device is folded from the folded state T3 shown in FIG. 8 to the unfolded state T1 shown in FIG. 6, at this point, the first direction may be a direction opposite to the X direction shown in FIG. 7. In the embodiments of the present disclosure, the folded state T3 where the included angle between the first main body 101 and the second main body 102 is 0° may mainly, unless otherwise specified, refer to that the flexible screen 10 is flipped out.

Figure 9:
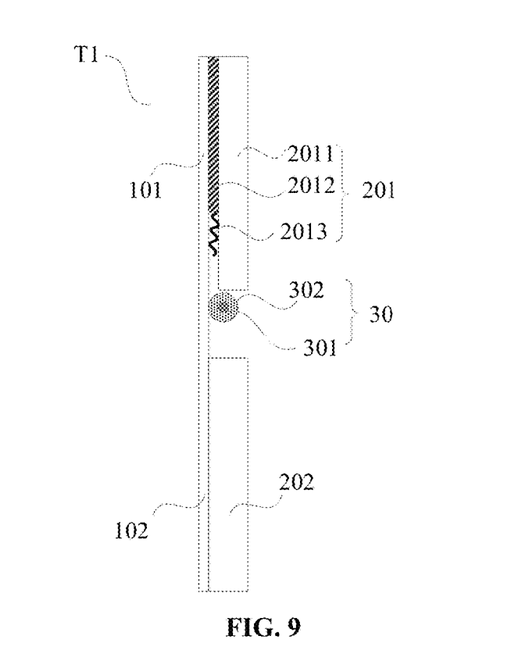
FIG. 9 illustrates a schematic of a display device in an unfolded state T1 according to the embodiments of the present disclosure.

In the embodiments of the present disclosure, FIG. 9 illustrates another schematic of the display device in the unfolded state T1. For example, the first support portion 201 may include an elastic element 2013 which is configured to provide an elastic force to the sliding element 2012. That is, when the first support portion 201 is folded relative to the second support portion 202 through the foldable structure 30, the elastic element 2013 may provide the elastic force to the sliding element 2012. In such way, during the folding process of the flexible screen 10 from the folded state where the included angle between the first main body 101 and the second main body 102 is 0° to the unfolded state where the included angle between the first main body 101 and the second main body 102 is 180°, the elastic force provided by the elastic element 2013 may stretch the flexible screen 10, and the third main body (e.g., the third main body 103 as shown in FIG. 5) and the foldable structure 30 may not be detached and arched, thereby effectively avoiding the creases during the folding process of the flexible screen 10, and improving the performance of the display device. Furthermore, the elastic element 2013 may be a spring in an implementation process.

Figure 10:
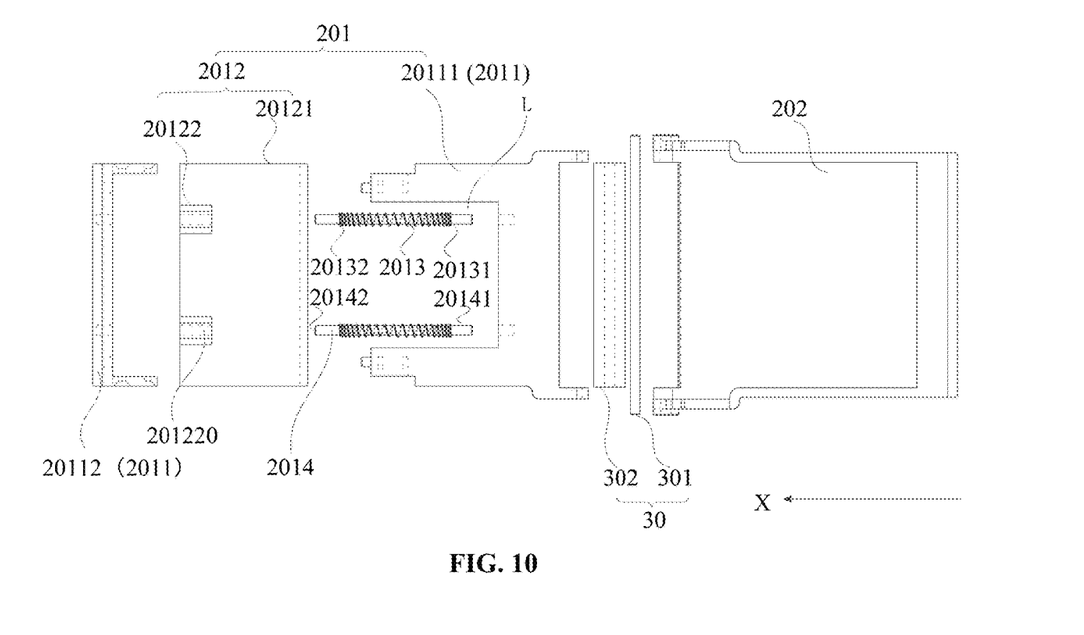
FIG. 10 illustrates an exploded structural schematic of a display device according to the embodiments of the present disclosure.
Figure 11:
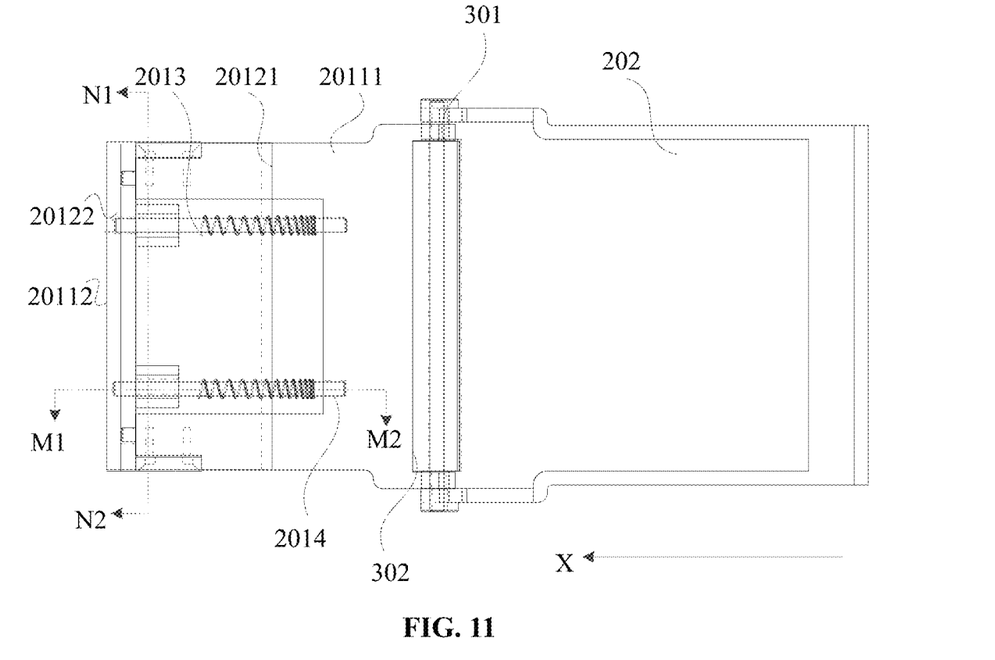
FIG. 11 illustrates a structural schematic of the display device shown in FIG. 11.
Figure 12:
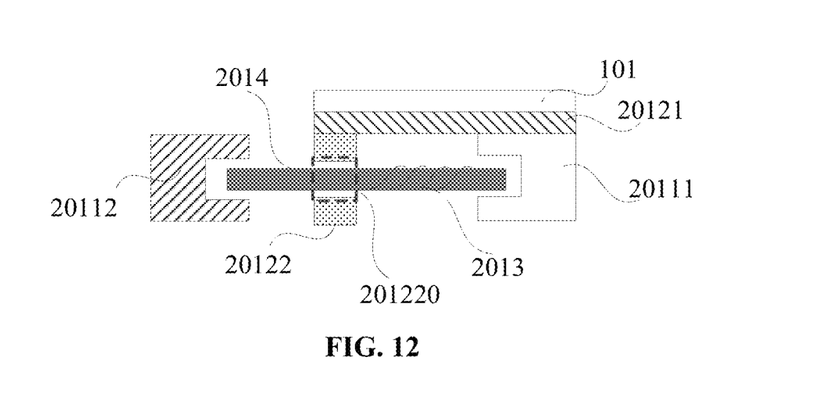
FIG. 12 illustrates a partial cross-sectional view of the display device shown in FIG. 11 along a direction M1-M2.

In the embodiments of the present disclosure, as shown in FIG. 10 and FIG. 11, FIG. 10 illustrates an exploded structural schematic of a display device, and FIG. 11 illustrates a structural schematic of elements of the display device assembled together along the first direction X in FIG. 10. For example, the sliding element 2012 may include an attaching portion 20121 and a plurality of protruding portions 20122; the protruding portions 20122 may be fixedly connected to the attaching portion 20121 which may be a plate shape; the attaching portion 20121 may be attached to the first main body 101; and the protruding portions 20122 may be disposed at a side of the attaching portion 20121 away from the first main body 101. FIG. 10 is a structural schematic of the sliding element 2012 including two protruding portions 20122. In an implementation process, the attaching portion 20121 and the protruding portions 20122 may be formed into a single piece and may also be a structure which is separately formed and be connected together. The attaching portion 20121 may be a plate shape, thereby effectively ensuring the sufficient attachment of the attaching portion 20121 and the first main body 101 and also ensuring the synchronous movement between the sliding element 2012 and the first main body 101. Meanwhile, the attaching portion 20121 may provide a desirable support to the first main body 101, which may improve the performance of the display device.

Referring to FIG. 10 and FIG. 11, the first support portion 201 may include a plurality of fixing rods 2014 extending along the first direction X, and the fixing rods 2014 and the protruding portions 20122 may be slidably connected to each other. In an implementation process, the sliding path of the protruding portions 20122 may be limited through the plurality of fixing rods 2014 on the first support portion 201, thereby implementing the control of the sliding path of the sliding element 2012 and improving the folding performance of the display device. Each protruding portion 20122 may be sleeved on a corresponding fixing rod 2014, that is, the number of the protruding portions 20122 may be the same as the number of the fixing rods 2014. As shown in FIG. 10 and FIG. 11, the first support portion 201 may include 2 fixing rods 2014 and 2 protruding portions 20122.

Referring to FIG. 10 and FIG. 11, the connection manner between the support element 2011, the second support portion 202, and the axle 301 may be the following: a through hole may be disposed at the support element 2011; a through hole may be disposed at the second support portion 202; after the axle sleeve 302 is sleeved on the axle 301, two ends of the axle 301 may sequentially pass through the through holes of the support element 2011 and the second support portion 202, thereby implementing the connection between the support element 2011 and the second support portion 202 through the combination of the axle 301 and the through holes, and also implementing the desirable support to the flexible screen 10. In another embodiment, one of the support element 2011 and the second support portion 202 may be disposed with a through hole, and the other one of the support element 2011 and the second support portion 202 may be disposed with a non-through opening; and the axle 301 may pass through the through hole and be inserted into the non-through opening.

In the embodiments of the present disclosure, the elastic element 2013 may be between the protruding portion 20122 and the foldable structure 30. When the first main body 101 is folded relative to the second main body 102, the elastic element 2013 between the protruding portion 20122 and the foldable structure 30 may apply an elastic force to the protruding portion 20122 along a direction away from the foldable structure 30. Since one end of the flexible screen 10 is fixed on the second support portion 202 and the other end of the flexible screen 10 is fixed on the sliding element 2012, the elastic force applied by the elastic element 2013 may ensure the flexible screen 10 to be at a stretched state, thereby improving the performance of the display device.

In an implementation process, as shown in FIG. 11, when the first support portion 201 is folded to the included angle of 0° relative to the second support portion 202 through the axle 301, the first support portion 201 may be accommodated into a trench of the second support portion 202, thereby improving the structural stability of the flexible screen 10.

Figure 13:
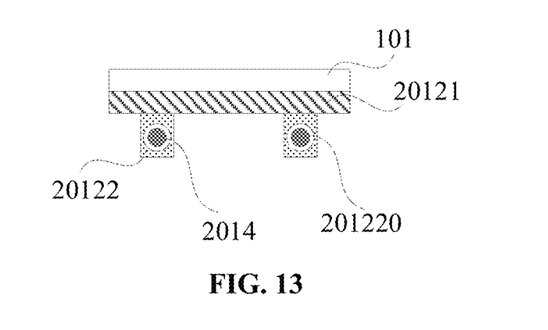
FIG. 13 illustrates a partial cross-sectional view of the display device shown in FIG. 11 along a direction N1-N2.

In the embodiments of the present disclosure, as shown in FIGS. 10-13, FIG. 12 illustrates a partial cross-sectional view along the extending direction of the fixing rod 2014 in FIG. 11 (i.e., a direction shown by M1-M2 in FIG. 11); and FIG. 13 illustrates a partial cross-sectional view along the protruding portion 20122, and also along a direction perpendicular to the extending direction of the fixing rod 2014 (i.e., a direction shown by N1-N2 in FIG. 11).

Figure 14:
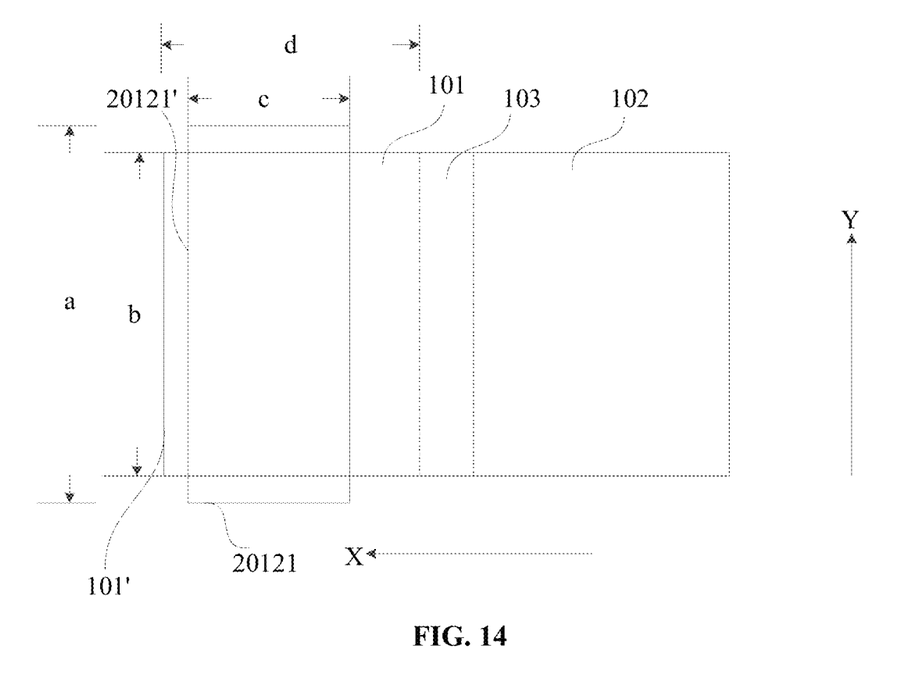
FIG. 14 illustrates a schematic of a relative positional relationship between an attaching portion and a first main body in a display device according to the embodiments of the present disclosure.

In the embodiments of the present disclosure, FIG. 14 illustrates a schematic of a relative positional relationship between the attaching portion 20121 and the first main body 101 in the display device. For example, the length of the attaching portion 20121 along a second direction may be greater than or equal to the length of the first main body 101 along the second direction. In such way, the first support portion 201 may be completely attached to the attaching portion 20121 of the first main body 101 through the attaching portion 20121, and also may effectively support the first main body 101, thereby improving the performance of the display device. In addition, the length of the attaching portion 20121 along the first direction may be less than the length of the first main body 101 along the first direction. The second direction may be in parallel with the plane of the first main body 101; the second direction may be perpendicular to the first direction; and the first direction may be a direction perpendicular to the folding axis where the first main body 101 is folded relative to the second main body 102. In such way, when the first main body 101 is folded relative to the second main body 102, sufficient space may be reserved for the attaching portion 20121, thus the sliding element 2012 may not collide with the foldable structure 30 when the sliding element 2012 slides relative to the support element 2011, thereby ensuring the folding performance of the display device and improving the service life of the display device. In addition, when the first main body 101 is completely attached to the second main body 102 (i.e., the display device is in a closed state), the attaching portion 20121 may be as close to the foldable structure 30 as possible, thereby ensuring the sufficient support of the first support portion 201 to the first main body 101 and also ensuring the performance of the display device. As shown in FIG. 14, the first direction may be the direction perpendicular to the extending direction of the central axis of the axle 301, such as the direction shown by the arrow X, and the second direction may be a direction perpendicular to the first direction, such as the direction shown by the arrow Y. For example, when the length of the attaching portion 20121 along the direction Y is a, the length of the main body 101 along the direction Y is b, the length of the attaching portion 20121 along the direction X is c, and the length of the main body 101 along the direction X is d, a≥b, and c<d. As shown in FIG. 14, a>b and c<d. For example, the relative positional relationship between the attaching portion 20121 and the first main body 101 along the direction X may be that a side 20121' of the attaching portion 20121 facing away from the foldable structure 30 may be disposed as coplanar with a side 101' of the first main body 101 facing away from the foldable structure 30. At this point, the distance between a side of the attaching portion 20121, adjacent to the foldable structure 30, and the foldable structure 30 may be greater than or equal to a preset distance; and the preset distance may be a maximum distance between the attaching portion 20121 and the foldable structure 30 when the flexible screen 10 is at the unfolded state T1, thereby ensuring the free folding of the flexible screen 10.

In the embodiments of the present disclosure, as shown in FIGS. 10-13, a through hole 201220 may be disposed at the protruding portion 20122 and pass through the protruding portion 20122 along the first direction (the direction shown by the arrow X), and the fixing rod 2014 may pass through the through hole 201220 of the protruding portion 20122. That is, the fixing pod 2014 may pass through the through hole 201220 at the protruding portion 20122 of the sliding element 2012, thereby ensuring the free sliding of the sliding element 2012 on the fixing rod 2014. In addition, the elastic element 2013 may be sleeved on the fixing rod 2014; the elastic element 2013 may always be between a first support element 20111 and the protruding portion 20122 along the first direction X under the block action of the first support element 20111 and the protruding portion 20122; and the elastic element 2013 may undergo tensile deformation or compression deformation along the first direction X, and the fixing rod 2014 may restrict the elastic element 2013 from deforming in other directions. Therefore, the relative sliding between the sliding element 2012 and the support element 2011 may be controlled through the elastic element 2013, the control of the folding degree of the first support portion 201 relative to the second support portion 202 may be implemented through the foldable structure 30, and the effective control of the folding degree of the first main body 101 relative to the second main body 102 may be further implemented, thereby improving the performance of the display device.

In the embodiments of the present disclosure, the configuration of the elastic element 2013 on the first support portion 201 may have the following two cases but may not be limited to the following two cases according to the embodiments of the present disclosure. The first configuration is that the elastic element 2013 may include a first end 20131 and a second end 20132 opposite to each other along the first direction (the direction shown by the arrow X), the first end 20131 may be fixedly connected to the support element 2011, and the second end 20132 may be fixedly connected to the protruding portion 20122. In such way, when the first main body 101 is folded relative to the second main body 102, the elastic element 2013 may have a certain control on the folding degree between the first main body 101 and the second main body 102, thereby ensuring the flexible screen 10 from being damaged due to folding, and also improving the performance of the display device.

In the embodiments of the present disclosure, the second configuration of the elastic element 2013 on the first support portion 201 is that the elastic element 2013 may include the first end 20131 and the second end 20132 opposite to each other along the first direction X, and both the first end 20131 and the second end 20132 may be free ends. In such way, it may not be necessary to fix the two ends of the elastic element 2013, which may simplify the manufacturing process of the display device and reduce the design cost of the display device; meanwhile, the control of the folding degree between the first main body 10 and the second main body 20 may be implemented, thereby improving the performance of the display device. In an implementation process, when the included angle between the first main body 101 and the second main body 102 is 180°, the length of the elastic element 2013 may be less than or equal to the original length of the elastic element 2013 in a free state. For example, when the included angle between the first main body 101 and the second main body 102 is 180°, if the length of the elastic element 2013 is A and the original length of the elastic element 2013 in a free state is B, then A≤B. At this point, the included angle between the first main body 101 and the second main body 102 is 180° and the elastic element 2013 may sufficiently ensure the stretch of the flexible screen 10, thereby effectively avoiding the creases of the flexible screen 10 and improving the performance of the display device. Furthermore, the configuration of the elastic element 2013 may be designed according to actual application scenarios, which may not be limited herein according to the embodiments of the present disclosure.

In the embodiments of the present disclosure, as shown in FIGS. 10-13, the support element 2011 may have a hollowed-out region L, and the fixing rod 2014 may be at the hollowed-out region L; a side surface of the support element 2011 adjacent to the first main body 101 may be in sliding contact with a surface of the attaching portion 20121 away from the first main body 101; and under the action of the support force providing by the support element 2011, the attaching portion 20121 may smoothly slide along the first direction relative to the support element 2011. In such way, during the process that the first main body 101 drives the attaching portion to fold relative to the second main body 102, the sliding element 2012 may slide freely relative to the support element 2011 in the hollowed-out region L, thereby improving the performance of the display device.

In the embodiments of the present disclosure, the fixing rod 2014 may be connected to the support element 2011 by any of an interference fit, a thread fit, or a snap fit, where the interference fit, the thread fit, and the snap fit may be used to implement the connection between the fixing rod 2014 and the support element 2011 using the manners in the existing technology. For example, the interference fit is a tight fit, and the axle diameter of the fixing rod 2014 is larger than the diameter of the support element 2011 which is matched with and connected to the fixing rod 2014. During the connecting process, the interference fit may be performed by pushing the fixing rod 2014 into the support element 2011 using a special tool; or using the characteristics of the thermal expansion and contraction, the hole corresponding to the support element 2011 may be heated, then the support element 2011 may quickly fit onto the fixing rod 2014 while the hole diameter is enlarged, and the support element 2011 and the fixing rod 2014 may be tightly fitted after cooling and shrinking. For the thread fit, that is, the fit of internal and external threaded parts, the parameters such as the thread form, specification, and pitch of the support element 2011 may be required to be equal to the corresponding parameters of the fixing rod 2014. For example, the internal and external threads of the support element 2011 and the fixing rod 2014 may all be triangular threads, trapezoidal threads, and the like. The sizes of the internal and external threads of the support element 2011 and the fixing rod 2014 may be the same and may not be relatively large or small. In addition, the pitches of the internal thread and the external thread of the support element 2011 and the fixing rod 2014 may be the same and may not be that one pitch is coarse, and another pitch is fine. Obviously, the fixed connection between the support element 2011 and the fixing rod 2014 may be implemented by other manners according to actual application scenarios, which may not be limited herein according to the embodiments of the present disclosure.

In the embodiments of the present disclosure, still in FIG. 10 and FIG. 11, the support element 2011 may include the first support element 20111 and a second support element 20112; the first support element 20111 and the second support element 20112 may be mated with each other along the first direction (the direction shown by the arrow X); and one end 20141 of the fixing rod 2014 may be in contact with the first support element 20111, and the other end 20142 of the fixing rod 2014 may be in contact with the second support element 20112. In an implementation process, after disposing the fixing rod 2014, the elastic element 2013, and the sliding element 2012 on the first support element 20111, the second support element 20112 and the first support element 20111 may then be mated together, thereby ensuring the structural stability of the support element 2011 and facilitating the effective installation of the sliding element 2012 on the fixing rod 2014; meanwhile, the hollowed-out region L may be formed at the support element 2011. In an implementation process, the first support element 20111 and the second support element 20112 may be mated and fixed together by correspondingly disposing a fixing hole and a fixing column at the mated portion of the first support element 20111 and the second support element 20112 (i.e., sides of the two support elements) and also by correspondingly disposing fixing structures such as bolts or rivets. Obviously, the first support element 20111 and the second support element 20112 may be mated together using other fixing manners, which may not be limited herein according to the embodiments of the present disclosure.

Figure 15:
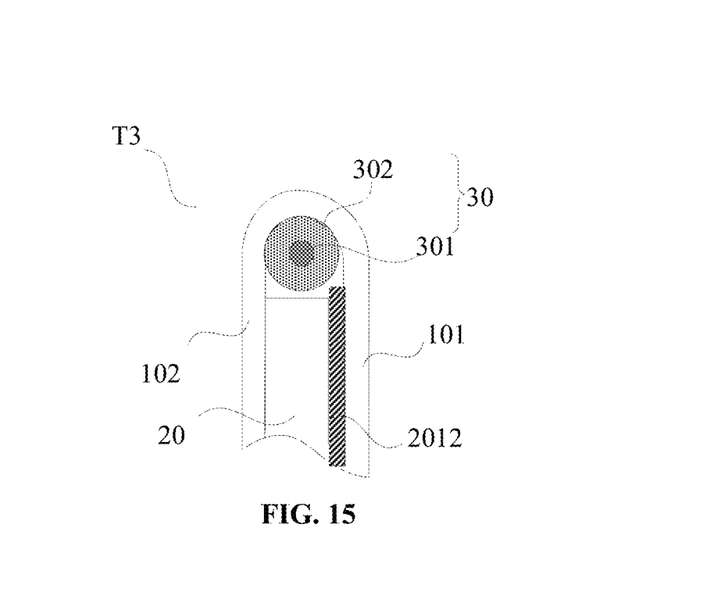
FIG. 15 illustrates an enlarged view of a region S in FIG. 8.

In the embodiments of the present disclosure, when the included angle between the first main body 101 and the second main body 102 is 0°, a minimum distance between the sliding element 2012 and the foldable structure 30 is a first distance, and 0 mm≤the first distance≤H mm, where 0≤H≤0.5. In an implementation process, FIG. 15 illustrates an enlarged view of a region S (area shown by a dashed box) in FIG. 8 when the included angle between the first main body 101 and the second main body 102 is 0°, where H may be 0.5. When the included angle between the first main body 101 and the second main body 102 is 0°, that is, when the first main body 101 and the second main body 102 are nearly completely attached together, the sliding element 2012 may be close to the foldable structure 30 and also may not be in contact with the foldable structure 30 or may nearly be in contact with the foldable structure 30, but there is no interaction between the sliding element 2012 and the foldable structure 30. Therefore, the effective support of the sliding element 2012 to the first main body 101 in such state may be implemented, the performance of the display device may be improved while effectively protecting the flexible screen 10. In an implementation process, the numerical range of H may be a range determined by manufacturing errors. Obviously, the actual numerical value of H may be determined according to actual application scenarios, which may not be limited herein according to the embodiments of the present disclosure.

In the embodiments of the present disclosure, still in FIG. 8 and FIG. 15, when the included angle between the first main body 101 and the second main body 102 is 0°, the first main body 101 may overlap the second main body 102, and the support structure 20 may be between the first main body 101 and the second main body 102. Therefore, the effective support for the first main body 101 and the second main body 102 may be respectively implemented through the support structure 20, and the structural stability of the display device when the included angle between the first main body 101 and the second main body 102 is 0° may be ensured, which may improve the performance of the display device.

Figure 16:
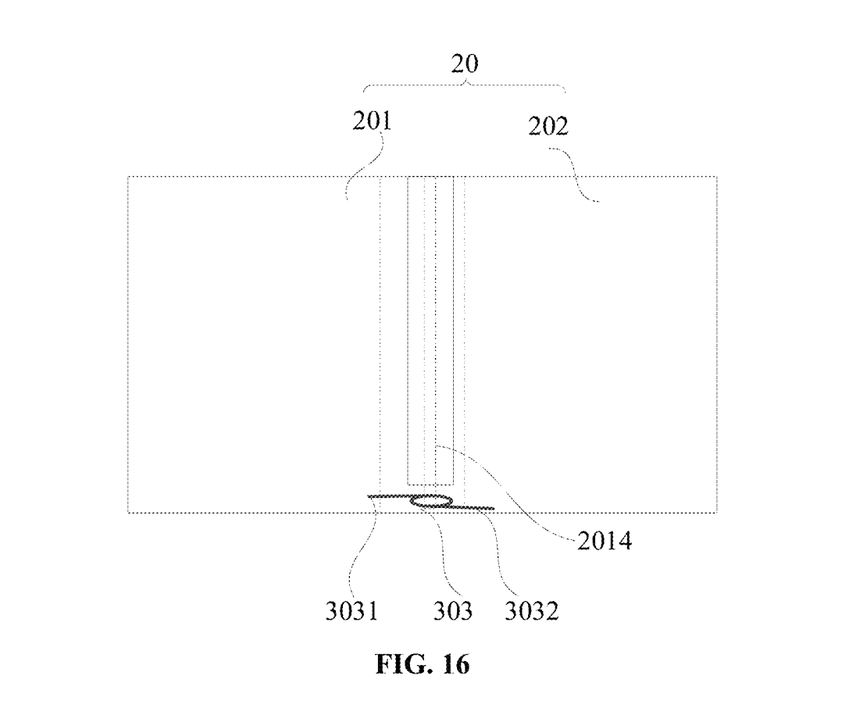
FIG. 16 illustrates another schematic of a foldable structure in a display device according to the embodiments of the present disclosure.

In the embodiments of the present disclosure, FIG. 16 illustrates another schematic of the foldable structure 30 in the display device. The foldable structure 30 may further include at least one damping element 303. The damping element 303 may include a third end 3031 and a fourth end 3032 opposite to each other. The third end 3031 may be connected to the axle 301, and the fourth end 3032 may be connected to the first support portion 201 or the second support portion 202. In an implementation process, the damping element 303 may be a damping axle or a damping hinge. In such way, when the first main body 101 is folded relative to the second main body 102, the rotation force of the foldable structure 30 may be attenuated to a certain extent through at least one damping element 303, thereby effectively limiting the folding degree between the first main body 101 and the second main body 102 to a certain extent. That is, the control of the folding speed between the first main body 101 and the second main body 102 may be implemented, thereby ensuring that the flexible screen 10 is protected from being damaged during the folding process. The quantity of damping elements 303 in FIG. 16 is 1. Obviously, the corresponding quantity of damping elements and damping elements with different structures may also be selected according to the requirement of actual application scenarios, which may not be limited herein according to the embodiments of the present disclosure.

From the above-mentioned embodiments, it can be noted that the display device provided by the present disclosure may achieve at least the following beneficial effects.

The embodiments of the present disclosure provide the display device. During the folding process of the display device, the first support portion, configured to support the first main body, may be folded relative to the second support portion, configured to support the second main body, through the foldable structure which overlaps the third main body; and at least a portion of the foldable structure may be in contact with the third main body and also roll relative to the third main body during the complete folding process. That is, at least a portion of the foldable structure may always be in contact with the third main body and also roll relative to the third main body when the first main body is folded relative to the second main body. On the one hand, the foldable structure may be configured to support the third main body during the folding process of the flexible screen. On the other hand, the friction between the foldable structure and the third main body may be rolling friction, and the flexible screen is prevented from being damaged during the complete folding process, thereby preventing the flexible screen from causing creases and effectively protecting the flexible screen.

Although the embodiments of the present disclosure have been described, those skilled in the art may make other changes and modifications to the embodiments of the present disclosure once the basic inventive concepts are known. Therefore, the appended claims may be intended to include the embodiments of the present disclosure and also all changes and modifications that fall within the scope of the disclosure.

Obviously, those skilled in the art may make various modifications and variations to the disclosure without departing from the spirit and scope of this application. In such way, if the modifications and variations of the present disclosure fall within the scope of the claims of the present disclosure and their equivalent technologies, the disclosure may also intend to include such modifications and variations.

What is claimed is:

1. A display device, comprising:
a flexible screen, including a first main body, a second main body, and a third main body, wherein the third main body, between the first main body and the second main body, is connected to each of the first main body and the second main body;
a support structure, including a first support portion and a second support portion, wherein the first support portion is configured to support the first main body, and the second support portion is configured to support the second main body; and
a foldable structure, wherein:
the foldable structure overlaps the third main body;
the first support portion and the second support portion are connected to each other through the foldable structure;
a working state of the display device includes a folding state, and the first main body overlaps the second main body in the folding state; and
during a folding process of the display device, at least a portion of the foldable structure is in contact with the third main body and configured to roll relative to the third main body;
wherein:
the first main body is slidably connected to the first support portion, and the second main body is fixedly connected to the second support portion;
wherein the first support portion includes a support element and a sliding element, and the sliding element is fixedly connected to the first main body and slidably connected to the support element;
wherein the first support portion further includes an elastic element configured to provide an elastic force to the sliding element;
wherein the sliding element includes an attaching portion and a plurality of protruding portions, wherein:
the plurality of protruding portions is fixedly connected to the attaching portion;
the attaching portion has a plate shape;
the attaching portion is attached to the first main body; and
the plurality of protruding portions is disposed at a side of the attaching portion away from the first main body;
the first support portion further includes a plurality of fixing rods which extends along the first direction and is slidably connected to the protruding portions; and
the elastic element is between a protruding portion and the foldable structure.

2. The display device according to claim 1, wherein:
the foldable structure includes an axle and an axle sleeve surrounding the axle;
the first support portion and the second portion are connected to each other through the axle; and
during the folding process of the display device, at least a portion of the axle sleeve is in contact with the third main body and configured to roll relative to the third main body.

3. The display device according to claim 2, wherein:
the axle and the axle sleeve are sleeved together through a clearance fit.

4. The display device according to claim 2, wherein:
the axle is made of a material including at least one of stainless steel, chromium carbide, high manganese steel, tungsten carbide, alumina ceramic, or nylon; and/or
the axle sleeve is made of a material including at least one of stainless steel, chromium carbide, high manganese steel, tungsten carbide, alumina ceramic, or nylon.

5. The display device according to claim 2, wherein:
the foldable structure further includes at least one damping element;
the damping element includes a third end and a fourth end opposite to each other; and
the third end is connected to the axle, and the fourth end is connected to the first support portion or the second support portion.

6. The display device according to claim 1, wherein:
when the first support portion is folded relative to the second support portion through the foldable structure, the sliding element slides relative to the support element along a first direction, wherein the first direction is a direction perpendicular to a folding axis where the first main body is folded relative to the second main body.

7. The display device according to claim 6, wherein:
a length of the attaching portion along a second direction is greater than or equal to a length of the first main body along the second direction; and
a length of the attaching portion along the first direction is less than a length of the first main body along the first direction, wherein the second direction is in parallel with a plane of the first main body and is perpendicular to the first direction.

8. The display device according to claim 6, wherein:
a through hole is disposed at the protruding portion and passes through the protruding portion along the first direction;
a fixing rod of the plurality of fixing rods passes through the through hole of the protruding portion; and
the elastic element sleeves on the fixing rod.

9. The display device according to claim 8, wherein:
the elastic element includes a first end and a second end opposite to each other along the first direction, the first end is fixedly connected to the support element, and the second end is fixedly connected to the protruding portion.

10. The display device according to claim 8, wherein:
the elastic element includes a first end and a second end opposite to each other along the first direction, and both the first end and the second end are free ends.

11. The display device according to claim 10, wherein:
when an included angle between the first main body and the second main body is 180°, a length of the elastic element is less than or equal to an original length of the elastic element in a free state.

12. The display device according to claim 6, wherein:
the support element has a hollowed-out region, and the fixing rod is at the hollowed-out region; and
a surface of a side of the support element adjacent to the first main body is in sliding contact with a surface of the attaching portion away from the first main body.

13. The display device according to claim 12, wherein:
the fixing rod is connected to the support element by one of an interference fit, a thread fit, or a snap fit.

14. The display device according to claim 12, wherein:
the support element includes a first support element and a second support element, and the first support element and the second support element are mated along the first direction; and
one end of the fixing rod is in contact with the first support element, and another end of the fixing rod is in contact with the second support element.

15. The display device according to claim 6, wherein:
when an included angle between the first main body and the second main body is 0°, a minimum distance between the sliding element and the foldable structure is a first distance, and 0 mm≤the first distance≤0.5 mm.

16. The display device according to claim 1, wherein:
when an included angle between the first main body and the second main body is 0°, the first main body overlaps the second main body, and the support structure is between the first main body and the second main body.

* * * * *